(12) United States Patent
Chen et al.

(10) Patent No.: US 11,243,479 B2
(45) Date of Patent: Feb. 8, 2022

(54) METHOD OF OPERATING SEMICONDUCTOR APPARATUS AND SEMICONDUCTOR APPARATUS

(71) Applicant: TAIWAN SEMICONDUCTOR MANUFACTURING CO., LTD., Hsinchu (TW)

(72) Inventors: Hsiang Chen, Hsinchu (TW); Sheng-Kang Yu, Hsinchu (TW); Shang-Chieh Chien, New Taipei (TW); Li-Jui Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/683,432

(22) Filed: Nov. 14, 2019

(65) Prior Publication Data

US 2021/0149317 A1 May 20, 2021

(51) Int. Cl.
*G03F 7/20* (2006.01)
*G03F 9/00* (2006.01)
*H05G 2/00* (2006.01)

(52) U.S. Cl.
CPC ...... *G03F 7/70925* (2013.01); *G03F 7/70033* (2013.01); *G03F 7/70491* (2013.01); *G03F 7/70858* (2013.01); *G03F 7/70891* (2013.01); *G03F 7/70908* (2013.01); *G03F 7/70916* (2013.01); *G03F 7/70975* (2013.01); *G03F 9/7096* (2013.01); *H05G 2/001* (2013.01); *H05G 2/005* (2013.01)

(58) Field of Classification Search
CPC .. G03F 7/70033; G03F 7/70491; G03F 7/708; G03F 7/70858; G03F 7/70875; G03F 7/70883; G03F 7/70891; G03F 7/70908; G03F 7/70916; G03F 7/70925; G03F 7/70975; G03F 9/7096; H05G 2/00; H05G 2/001; H05G 2/002; H05G 2/003; H05G 2/005; H05G 2/006; H05G 2/008
USPC ............ 250/504 R; 355/30, 67, 77; 359/359
See application file for complete search history.

(56) References Cited

U.S. PATENT DOCUMENTS

| | | | | |
|---|---|---|---|---|
| 2008/0142736 | A1* | 6/2008 | Wassink | G03F 7/70858 250/492.1 |
| 2008/0142741 | A1* | 6/2008 | Van Herpen | B82Y 10/00 250/492.22 |
| 2008/0159471 | A1* | 7/2008 | Wilhelmus Van Herpen | G03F 7/70916 378/34 |
| 2008/0203325 | A1* | 8/2008 | Vaudravange | H05G 2/003 250/503.1 |
| 2012/0223257 | A1* | 9/2012 | Nagai | B23K 26/36 250/504 R |
| 2012/0248343 | A1* | 10/2012 | Nagai | H05G 2/003 250/504 R |

(Continued)

*Primary Examiner* — Colin W Kreutzer
(74) *Attorney, Agent, or Firm* — Maschoff Brennan

(57) ABSTRACT

A method of controlling a temperature of the semiconductor device includes operating an semiconductor apparatus; maintaining a temperature of a vessel of the semiconductor apparatus with a first cooling output by a cooling controller; heating the vessel for removing a material on the vessel; transferring a first signal, by a converter, to the cooling controller when heating the vessel; and reducing the first cooling output to a second cooling output by the cooling controller base on the first signal.

20 Claims, 5 Drawing Sheets

(56) References Cited

U.S. PATENT DOCUMENTS

2015/0338753 A1* 11/2015 Riepen ................ G03F 7/70008
                                                            250/504 R

* cited by examiner

METHOD OF OPERATING SEMICONDUCTOR APPARATUS AND SEMICONDUCTOR APPARATUS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For example, higher resolution lithography processes have been developed. One lithography technique is extreme ultraviolet lithography (EUVL).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
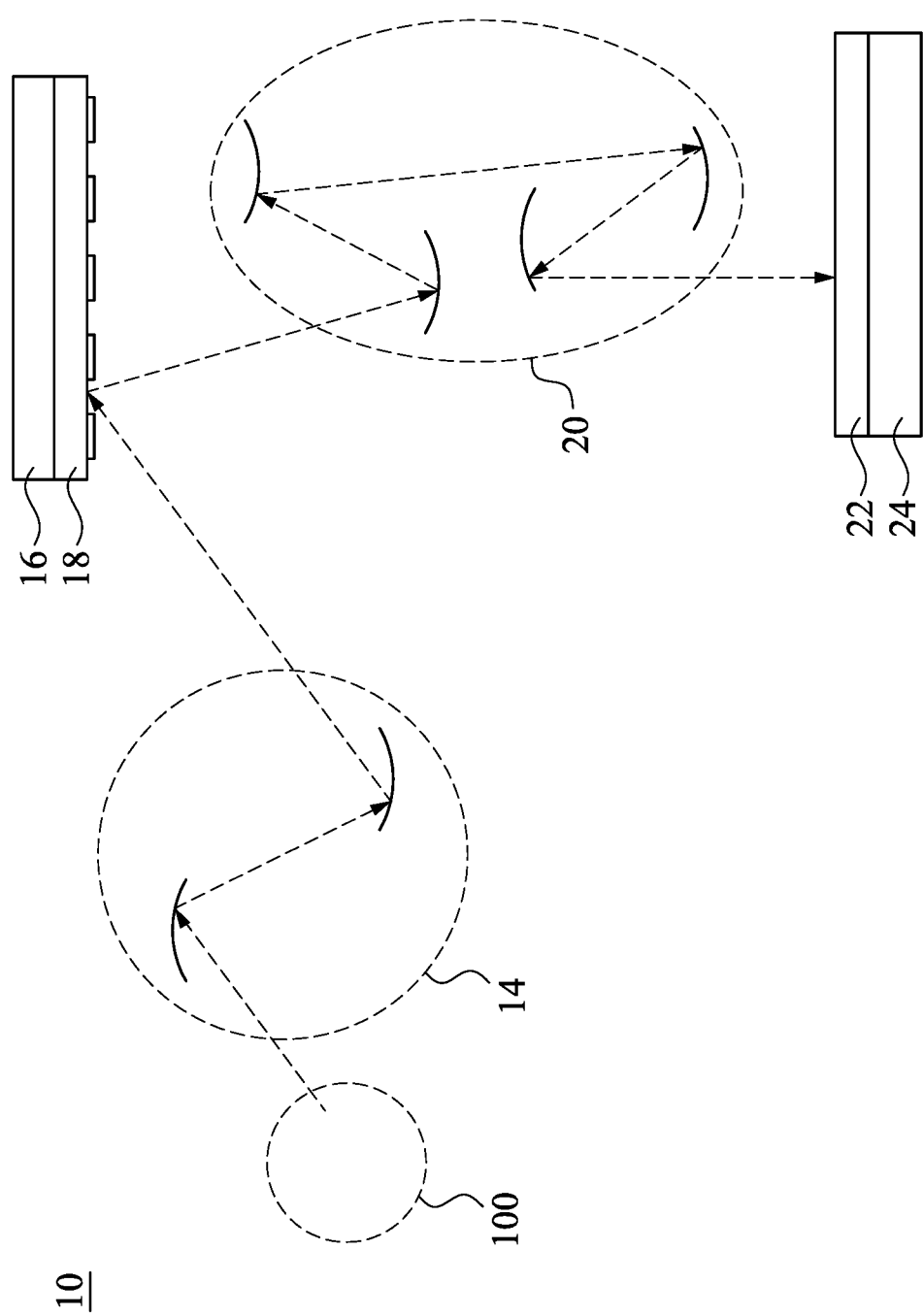
FIG. 1 is a schematic view of an lithography system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic view of a lithography system 10 in accordance with some embodiments of the present disclosure. The lithography system 10 may also be generically referred to as a scanner that is operable to perform lithography exposing processes with respective radiation source and exposure mode. In some embodiments, the lithography system 10 is an extreme ultraviolet (EUV) lithography system designed to expose a resist layer by EUV light. The resist layer is a material sensitive to the EUV light. The lithography system 10 employs a semiconductor apparatus 100 to generate EUV light, such as EUV light having a wavelength ranging between about 1 nm and about 100 nm. In some embodiments, the semiconductor apparatus 100 generates EUV light with a wavelength centered at about 13.5 nm. Accordingly, the semiconductor apparatus 100 is referred to as an EUV radiation source. In some embodiments, the semiconductor apparatus 100 utilizes a mechanism of laser-produced plasma (LPP) to generate the EUV radiation, which will be further described later.

The lithography system 10 also employs an illuminator 14. In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the semiconductor apparatus 100 onto a mask stage 16, or onto a mask 18 secured on the mask stage 16. In some embodiments, the semiconductor apparatus 100 generates light in the EUV wavelength range, reflective optics is employed.

The lithography system 10 also includes the mask stage 16 configured to secure a mask 18. In some embodiments, the mask stage 16 includes an electrostatic chuck (e-chuck) to secure the mask 18. This is because that gas molecules absorb EUV light and the lithography system 10 for the EUV lithography patterning is maintained in a vacuum environment to avoid the EUV intensity loss. In the present disclosure, the terms of mask, photomask, and reticle are used to refer to the same item. In some embodiments, the lithography system 10 is an EUV lithography system, and the mask 18 is a reflective mask. The mask 18 is provided for illustration. The mask 18 includes a substrate with a suitable material, such as a low thermal expansion material (LTEM) or fused quartz. In various examples, the LTEM includes $TiO_2$ doped $SiO_2$, or other suitable materials with low thermal expansion. The mask 18 includes a multiple reflective multiple layers (ML) deposited on the substrate. The mask 18 may further include a capping layer, such as ruthenium (Ru), disposed on the ML for protection. The mask 18 further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The lithography system 10 also includes a projection optics module (or projection optics box) (POB) 20 for imaging the pattern of the mask 18 on to a semiconductor wafer 22 secured on a substrate stage 24 of the lithography system 10. The POB 20 has refractive optics (such as for UV lithography system) or alternatively reflective optics (such as for EUV lithography system) in various embodiments. The light directed from the mask 18, carrying the image of the pattern defined on the mask 18, is collected by the POB 20. The illuminator 14 and the POB 20 are collectively referred to an optical module of the lithography system 10.

The lithography system 10 also includes the substrate stage 24 to secure the semiconductor wafer 22. In some embodiments, the semiconductor wafer 22 may be a silicon wafer or other type of wafer to be patterned. The semiconductor wafer 22 is coated with the resist layer sensitive to the radiation beam, such as EUV light in some embodiments. Various components including those described above are integrated together and are operable to perform lithography exposing processes. The lithography system 10 may further include other modules or be integrated with (or be coupled with) other modules. In some embodiments, the lithography system 10 includes a gas supply module to provide hydrogen gas to the semiconductor apparatus 100.

Figure 2:
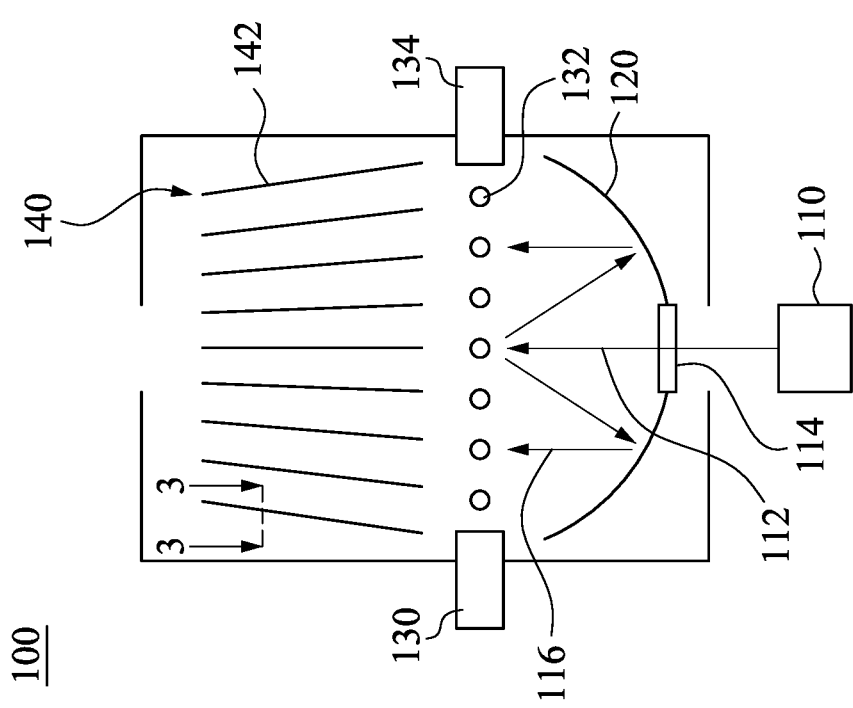
FIG. 2 is a cross-sectional view of the semiconductor apparatus of FIG. 1.

FIG. 2 is a cross-sectional view of the semiconductor apparatus 100 of FIG. 1. The semiconductor apparatus 100 is a radiation source of the EUV lithography system 10. The semiconductor apparatus 100 employs a laser produced plasma (LPP) mechanism to generate plasma and further generate EUV light from the plasma. The semiconductor apparatus 100 includes a laser 110, such as pulse carbon dioxide ($CO_2$) laser to generate laser beam 112. The laser beam 112 is directed through an output window 114 integrated with a collector 120 (also referred to as LPP collector or EUV collector). The output window 114 adopts a suitable material substantially transparent to the laser beam 112. The collector 120 is designed with proper coating material and shape, functioning as a mirror for EUV collection, reflection and focus. In some embodiments, the collector 120 is designed to have an ellipsoidal geometry. In some embodiments, the coating material of the collector 120 is similar to the reflective multilayer of the EUV mask 18. In some embodiments, the collector 130 may further include a grating structure designed to effectively scatter the laser beam directed onto the collector 130. For example, a silicon nitride layer is coated on the collector 130 and is patterned to have a grating pattern.

The semiconductor apparatus 100 further includes a droplet generator 130 and a catcher 134. The laser beam 112 is directed to heat a target material 132, such as Tin droplets. The target material 132 is generated by the droplet generator 130. The catcher 134 is further configured to catch the target material 132. Thus generated high temperature plasma further produces EUV radiation 116, which is collected by the collector 120. The collector 120 further reflects and focuses the EUV radiation for the lithography exposing processes. The pulses of the laser 110 and the droplet generating rate of the droplet generator 130 are controlled to be synchronized such that the target material 132 receives peak powers consistently from the laser pulses of the laser 110.

The semiconductor apparatus 100 is configured in an enclosed space that is referred to as a vessel 140. The vessel 140 is maintained in a vacuum environment since the air absorbs the EUV radiation 116. The semiconductor apparatus 100 may further be integrated with or coupled with other units/modules. For example, a gas supply module may be coupled with the semiconductor apparatus 100, thereby providing hydrogen gas for various protection functions, which include effectively protecting the collector 120 from the contaminations by particles of the target material 132.

Figure 3:
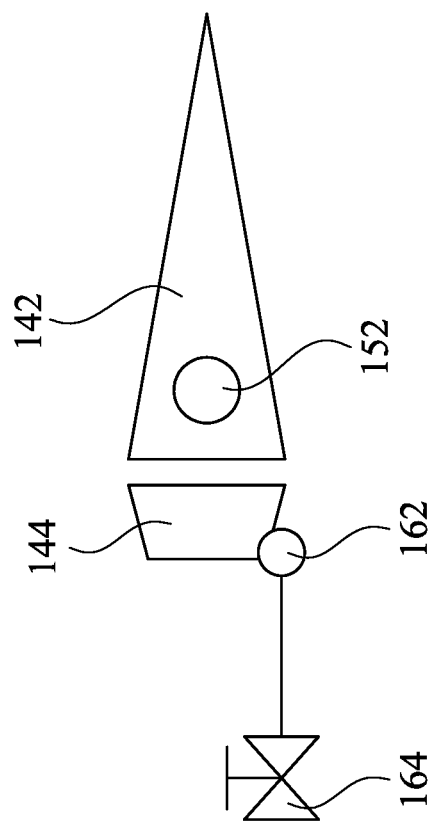
FIG. 3 is a cross-sectional view taken along line 3-3 of FIG. 2.

FIG. 3 is a cross-sectional view taken along line 3-3 of FIG. 2. Reference is made to FIG. 2, and FIG. 3, the source vessel 140 includes a plurality of vanes 142. The vanes 142 are radially oriented and are arranged to allow EUV radiation 116 to travel from the collector 120 to the illuminator 14 and may be designed to minimize EUV radiation obscuration. The semiconductor apparatus 100 further includes a connection structure 144 configured to connect and support the vanes 142. In some embodiments, the connection structure 144 is located on an outer surface of the vessel 140. The semiconductor apparatus 100 further includes a heater 152 in each of the vanes 142. The heater 152 is configured to increase a temperature of the vane 142.

The semiconductor apparatus 100 further includes a fluid channel 162 disposed on the connection structure 144, and the fluid channel 162 is adjacent to the vanes 142. In addition, the fluid channel 162 may surround the vessel 140. In some embodiment, the fluid channel 162 has a cooling fluid therein, and the cooling fluid is configured to cool the vanes 142. Therefore, the fluid channel 162 may be configured to cool gas flowing through the vanes 142 and/or to condense target material vapors that may undesirably absorb EUV radiation 116, e.g. tin vapor when tin is used as the target material 132. In some embodiments, the cooling fluid may cool the vanes 142 through heat radiation. That is, the fluid channel 162 and the cooling fluid are spaced apart from the vanes 142. In some other embodiments, the cooling fluid may further cool the vanes 142 through heat conduction with the connection structure 144.

In the operation of the semiconductor apparatus 100, the target material 132 is irradiated by one or more pulses to generate plasma. Typically, irradiated target material 132 moves along the beam direction and spreads into a wide solid angle. Therefore, a portion of the target material 132 may be collected by the vanes 142, which is temperature controlled. By-products of the target material irradiation may include metal dust, target material vapor and microdroplets or clusters and can be in several forms. The vanes 142 may function to collect liquids and solids (in some cases remelting solids) and/or condensing vapors. For a target material 132 containing Sn, some or all of the operable surfaces of the vanes 142 may be maintained at a temperature above the melting point of Sn, e.g., above about 232° C. At this temperature, micro-droplets may stick to the surface of the vanes 142, and may flow downwardly by gravitational force. Solidified metal dust of the target material 132 may be re-melted into the molten material and also flow downwardly.

The compounds of the target material 132 may also be trapped by the liquid metal flow and removed from the vessel 140. In some embodiments, the vanes 142 may have inter-connecting channels (not shown) for directing liquid metal flow from surfaces to the bottom where the liquid metal may be collected. The location and direction of the channels may be configured relative to the EUV source orientation (e.g. the light source axis may be tilted relative to horizontal at about 28 degrees) to ensure proper flow of liquid on the vanes 142. On the other hand, in some embodiments, some or all of the operable surfaces of the vanes 142 may be maintained at a temperature below the melting point of the target material 132. At these temperatures, condensation is promoted and liquids and solids may be allowed to accumulate on the vanes 142. The state of operating the lithography system 10 described above refers to a warm state W. The term "warm state W" herein refers to the state of performing lithography process when the temperature of the vanes 142 is below the melting point of the target material 132.

Figure 4:
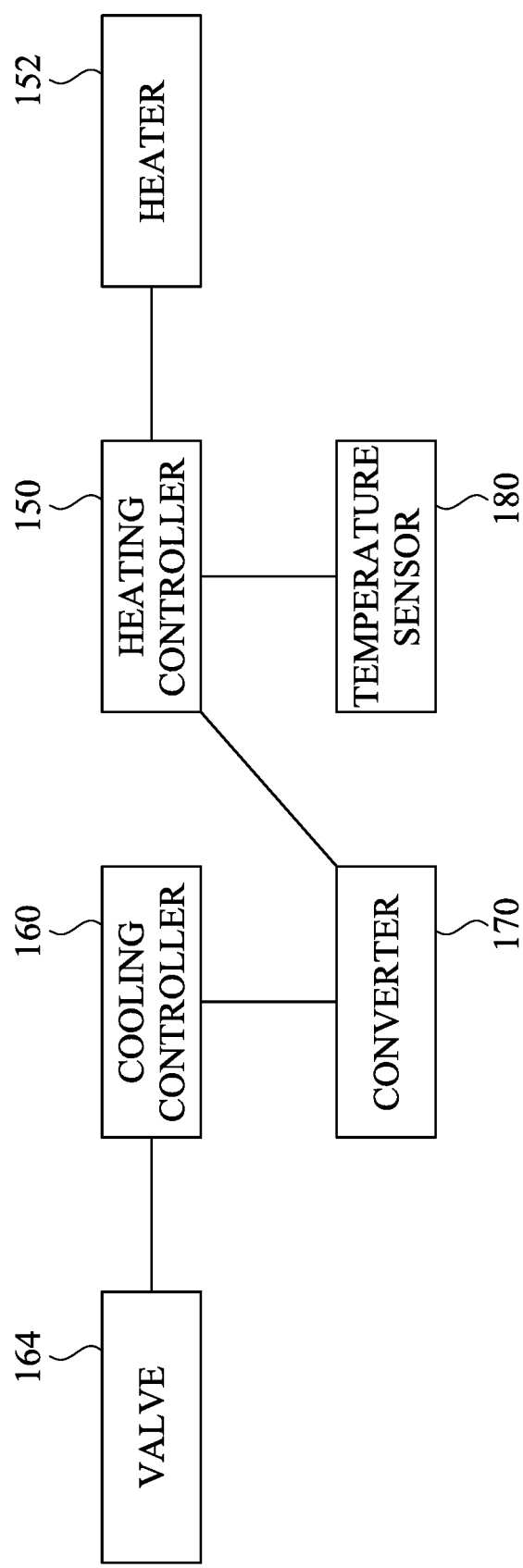
FIG. 4 is a block diagram of the semiconductor apparatus of FIG. 1.

FIG. 4 is a block diagram of the semiconductor apparatus 100 of FIG. 1. Reference is made to FIG. 3 and FIG. 4. The semiconductor apparatus 100 further includes a heating controller 150, a cooling controller 160, a valve 164, a converter 170, and a temperature sensor 180. The heating controller 150 is electrically connected with the heater 152. The cooling controller 160 is coupled with the valve 164. The converter 170 is electrically connected with the cooling controller 160, and the converter 170 is configured to transfer a signal to the cooling controller 160 to adjust a flow rate of the cooling fluid. The temperature sensor 180 is electrically connected with the heating controller 150. The temperature sensor 180 is configured to measure the temperature of the vessel 140. In some embodiments, when the temperature of the vessel 140 is increased by the heater 152, the cooling controller 160 is configured to reduce a flow rate of the cooling fluid through the valve 164, thereby reaching a higher target temperature rapidly. In some embodiments, when the temperature of the vessel 140 is decreased, the cooling controller 160 is configured to increase a flow rate of the cooling fluid through the valve 164, thereby reaching a lower target temperature rapidly.

It is noted that the aforementioned structures and connection relations will not be repeated hereinafter. In the following description, a method of controlling the temperature of the semiconductor apparatus 100 will be described.

Figure 5:
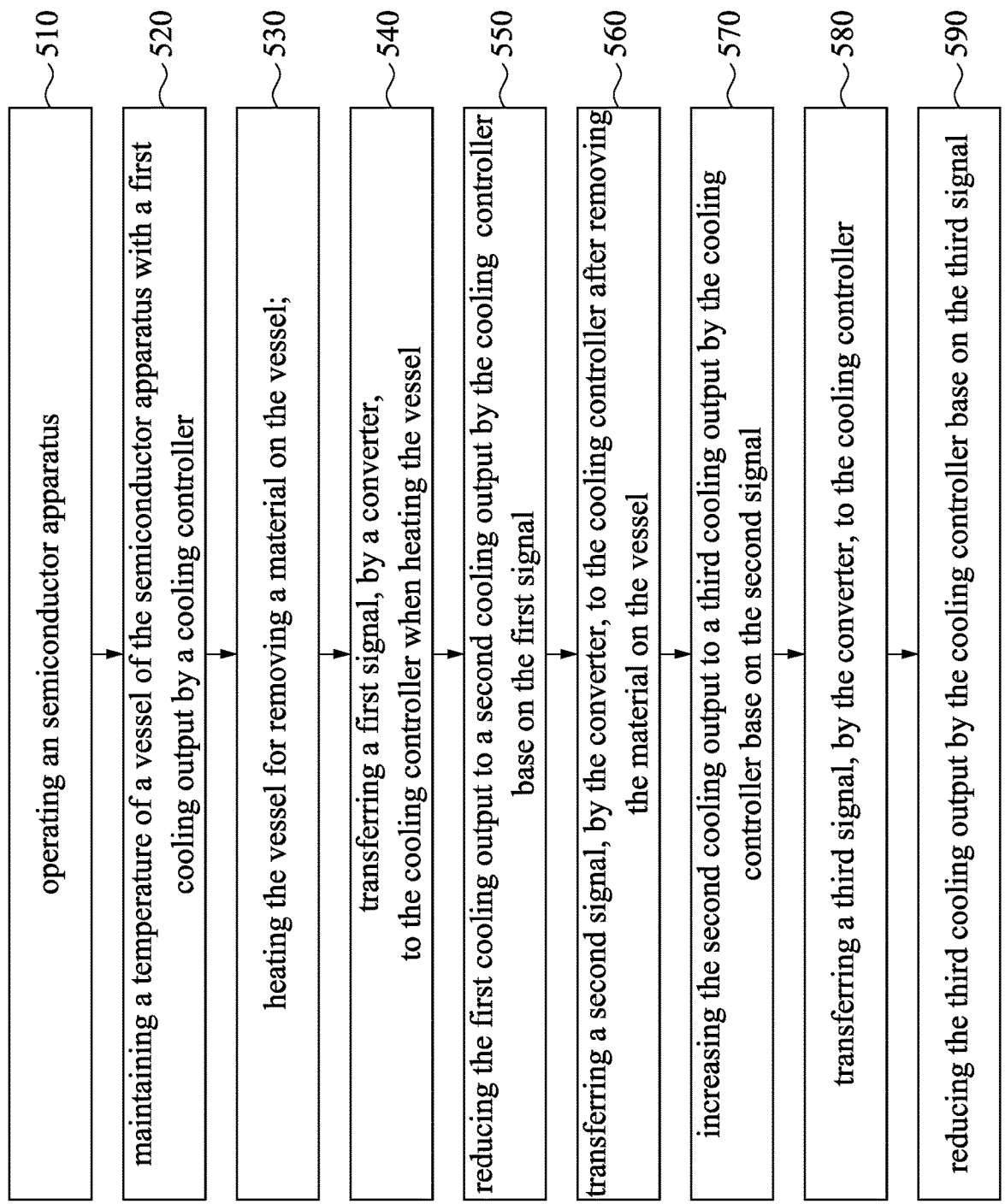
FIG. 5 is a flow chart of a method of controlling the temperature of the semiconductor apparatus according to some embodiments of the present disclosure.
Figure 6:
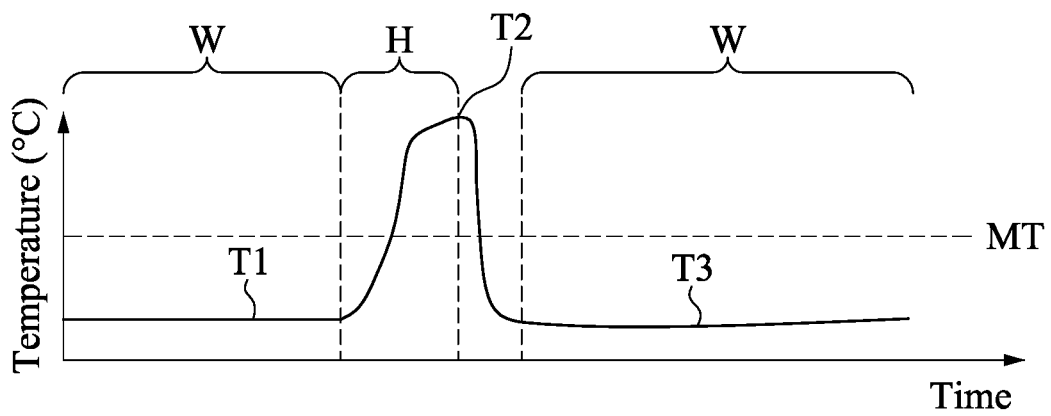
FIG. 6 is a graph of temperature of the vessel with time according to some embodiments of the present disclosure.
Figure 7:
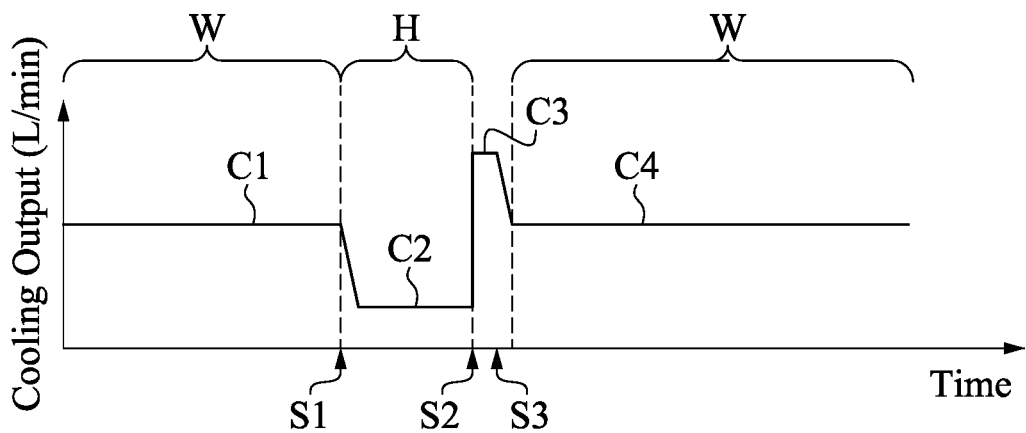
FIG. 7 is a graph of cooling output of the cooling controller with time.
Figure 8:
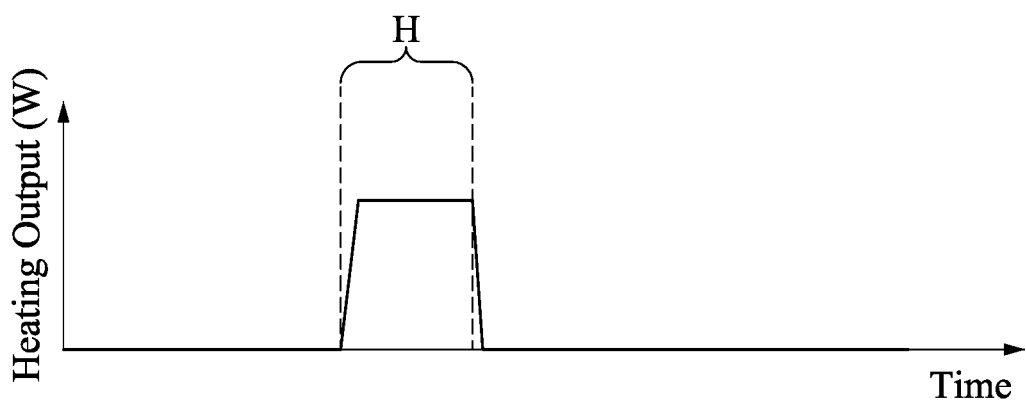
FIG. 8 is a graph of heating power of the heating controller with time.

FIG. 5 is a flow chart of a method of controlling the temperature of the semiconductor apparatus 100 according to some embodiments of the present disclosure. FIG. 6 is a graph of temperature of the vessel 140 with time according to some embodiments of the present disclosure. FIG. 7 is a graph of cooling output of the cooling controller 160 with time, in which the cooling output is referred to as the flow rate of the cooling fluid associated with the opening degree of the vale 164 (see FIG. 3 or 4). FIG. 8 is a graph of heating power of the heating controller 150 with time. The method begins with step 510 in which the semiconductor apparatus 100 is operated. Specifically, as shown in FIG. 6 and FIG. 8, the vessel 140 (see FIG. 2) is in the warm state W such that there is no heating output from the heating controller 150 (see FIG. 4).

Reference is made to FIG. 4, FIG. 6, and FIG. 7, the method includes a step 520 of FIG. 5 in which the temperature T1 of the vessel 140 of the semiconductor apparatus 100 (see FIG. 2) is maintained with a first cooling output C1 by the cooling controller 160. Specifically, during the lithography process, plasma may generate heat and the temperature of the vessel 140 is increased. Therefore, in order to prevent the semiconductor apparatus 100 from damage due to overheating, the cooling controller 160 is configured to keep the vessel 140 in a suitable temperature range. In some embodiment, the suitable temperature range may be from about 135° C. to about 145° C., for example, the suitable temperature may be about 140° C. As a result, the temperature T1 of the vessel 140 during the warm state W is below a melting point MT of the target material 132 on the vessel 140. Otherwise, the target material 132 may be melted, and spitting may happen. For example, the temperature of the vessel 140 may be monitored through the temperature sensor 180 and is controlled through the cooling controller 160 during the warm state W such that the temperature T1 of the vessel 140 is remained below the melting point MT of the target material 132. In some embodiments, when the target material 132 on the vessel 140 is Sn, the melting point of Sn, e.g., is about 232° C. In some embodiments, the cooling output C1 may be in a range from about 190 liter per minute to about 210 liter per minute, for example, the cooling output C1 may be about 200 liter per minute.

Reference is made to FIG. 4 FIG. 7, and FIG. 8, the method includes a step 530 of FIG. 5 in which the vessel 140 (see FIG. 2) is heated for removing the target material 132 (see FIG. 2) on the vessel 140. The state for removing the target material 132 is referred as "hot state H". As shown in FIG. 6, the temperature of the vessel 140 during hot state H is increased over the melting point MT of the material on the vessel 140. As mentioned above, the micro-droplet of target material 132 or re-melted target material 132 may flow downward to be removed. In some embodiments, the semiconductor system 100 is set to perform target material 132 removing process twice per day to extend the life-time of the semiconductor apparatus 100 (see FIG. 2). In some embodiments, the heating output may be in a range from about 1900 watt to about 2100 watt, For example, the heating output may be about 2000 watt. In some embodiment, the criterion of the hot state H is that the temperature of the vessel 140 is higher than the melting temperature MT for more than at least 30 minutes after the heating of the vessel 140 begins. Specifically, during the hot state H, the lithography process may be performed continuously. In other words, the target material 132 removing process is performed in-line, and the target material 132 removing process can be performed simultaneously with the lithography process.

Reference is made to FIG. 4, FIG. 6, and FIG. 7, the method includes a step 540 of FIG. 5 in which a first signal S1 is transferred by the converter 170 to the cooling controller 160 when the vessel 140 (see FIG. 2) is started to be heated. In some embodiments, the converter 170 may transfer the first signal S1 when the heater 152 is controlled by the heating controller 150 to heat up the vessel 140. The cooling controller 160 that receives the first signal S1 may reduce the cooling output C1 such that the heating rate of the vessel 140 is increased. In alternative embodiments, the first signal S1 may depend on the temperature data of the vessel 140 measured by the temperature sensor 180. For example, once the vessel 140 is heated by the heater 152 and the temperature of the vessel 140 starts to be increased, the converter 170 then transfers the first signal S1 according to the temperature data which indicating that the vessel 140 is heated.

Reference is made to FIG. 4 and FIG. 6, the method includes a step 550 of FIG. 5 in which the first cooling output C1 is reduced to a second cooling output C2 by the cooling controller 160 base on the first signal S1. In some embodiments, the cooling controller 160 may adjust the volume of the cooling liquid flowing within the liquid channel 162 (see FIG. 3) depends on the first signal S1 by controlling the valve 164, thereby determine the cooling output C2. In other words, the cooling controller 160 may adjust the flow rate of the cooling liquid in the liquid channel 162. For example, the cooling controller 160 may control the opening degree of the vale 164 to be reduced. As a result, the heating rate of the vessel 140 can be increased, thereby reducing the possibility of target material 132 spitting.

In a traditional lithography system, its vessel is continuously cooled by a cooling fluid with a constant flow rate. However, during a hot state of the traditional lithography system, the cooling fluid with the constant flow rate would reduce heating efficiency of a heater. Stated differently, since the cooling output is kept the same even during the hot state, heating power may be wasted and the power cost is higher. On the other hand, in some embodiments of the present disclosure, the cooling fluid in the liquid channel 162 (see FIG. 3) having a less flow rate (i.e., the second cooling output C2 of FIG. 7) can increase the heating rate of the vessel 140 (see FIG. 2) during the hot state H. Moreover, the cooling output for cooling the vessel 140 during the hot state H can be saved. In some embodiments, the heating power of the heater 152 during the hot state H may be reduced, and thus the power for heating the vessel 140 can be saved.

Reference is made to FIG. 4 and FIG. 6, the method includes a step 560 of FIG. 5 in which a second signal S2 is transferred by the converter 170 to the cooling controller 160 after removing the target material 132 on the vessel 140. When the temperature of the vessel 140 has satisfied the criterion of the hot state H, the heater 152 is controlled by the heating controller 150 to stop heating the vessel 140, and the converter 170 may transfer the second signal S2. Therefore, the cooling controller 160 that receives the second signal S2 may increase the second cooling output C2 to reduce the temperature of the vessel 140 back to the temperature T1 corresponding to the warm state W.

Reference is made to FIG. 4, FIG. 6, and FIG. 7, the method includes a step 570 of FIG. 5 in which the second cooling output C2 is increased to a third cooling output C3 by the cooling controller 160 base on the second signal S2. Third cooling output C3 is greater than the first cooling output C1. In some embodiments, the cooling controller 160 may adjust the volume of the cooling liquid flowing within the liquid channel 162 depending on the second signal S2 by controlling the valve 164, thereby determining the third cooling output C3. In other words, the cooling controller 160 may adjust the flow rate of the cooling liquid in the liquid channel 162. For example, the cooling controller 160 may control the opening degree of the vale 164 to be increased. As a result, the cooling rate of the vessel 140 can be increased. Since the temperature of the vessel 140 is decreased from a temperature T2 that is higher than the melting temperature MT, the increased cooling rate may shorten a time from the temperature T2 to the melting temperature MT, thereby reducing the possibility of target material 132 spitting and contamination of the collector 120.

Reference is made to FIG. 4, FIG. 6, and FIG. 7, the method includes a step 580 of FIG. 5 in which a third signal S3 is transferred by the converter 170 to the cooling controller 160. When the temperature of the vessel 140 is reduced from the temperature T2 to the temperature T3 that is close to the temperature T1, the converter 170 may transfer the third signal S3. Therefore, the cooling controller 160 that receives the third signal S3 may reduce the third cooling output C3 such that the temperature of the vessel 140 may gradually be reduced to the temperature T3 corresponding to the warm state W.

Reference is made to FIG. 4, FIG. 6, and FIG. 7, the method includes a step 590 of FIG. 5 in which the third cooling output C3 is reduced to the fourth cooling output C4 by the cooling controller 160 base on the third signal S3. When the temperature of the vessel 140 is reduced to the temperature T3 that is substantially equal to the temperature T1, the fourth cooling output C4 that is substantially equal to the first cooling output C1 may maintain the vessel 140 being in the warm state W. In other words, after the hot state H, the temperature of the vessel 140 and the cooling output setting are recover to the setting in the warm state W until next hot state H begins.

While the method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

As described above, the semiconductor apparatus includes a convert that can adjust the cooling output depending on a temperature of the vessel measured by a temperature sensor. When the semiconductor apparatus is in a warm state, the temperature of the vessel can be maintained within a suitable temperature such that the semiconductor apparatus can be prevented from damage due to overheating. When the semiconductor apparatus is in a hot state, the cooling output can be reduced by the cooling controller that receives a signal from the converter such that the heating rate of the vessel can be increased, thereby reducing the possibility of target material spitting. Accordingly, the time needed for heating the vessel during the hot state can be shortened, and the power for cooling the vessel during the hot state can be saved. When the hot state is finished, the cooling output can be increased by the cooling controller that receives another signal form the converter such that the cooling rate of the vessel can be increased. Accordingly, the time needed for cooling the vessel can be shortened, thereby reducing the possibility of target material spitting and contamination of the collector.

According to some embodiments, a method of controlling a temperature of the semiconductor device includes operating an semiconductor apparatus; maintaining a temperature of a vessel of the semiconductor apparatus with a first cooling output by a cooling controller; heating the vessel for removing a material on the vessel; transferring a first signal, by a converter, to the cooling controller when heating the vessel; and reducing the first cooling output to a second cooling output by the cooling controller base on the first signal.

According to some embodiments, a method of controlling a temperature of the semiconductor device includes heating a vessel of an semiconductor apparatus for removing a material on the vessel; transferring a first signal, by a converter, to a cooling controller after removing the material on the vessel; and increasing a cooling output of the cooling controller to increase an opening degree of a valve on the vessel base on the first signal.

According to some embodiments, a apparatus includes a vessel, a heater, a fluid channel, a valve, a cooling controller, and a converter. The heater is in the vessel and is configured to increase a temperature of the vessel. The fluid channel is on an outer surface of the vessel and has a cooling fluid therein. The valve is connected with the fluid channel. The cooling controller is coupled with the valve. The converter is electrically connected with the cooling controller, and the converter is configured to transfer a signal to the cooling controller to reduce a flow rate of the cooling fluid.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not de depart from the spirit and scope of the present disclosure, and that they may make various changes, substitutions, and alterations herein without departing from the spirit and scope of the present disclosure.

What is claimed is:

1. A method, comprising:
operating a semiconductor apparatus;
maintaining a temperature of a vessel of the semiconductor apparatus with a first cooling output by a cooling controller, wherein the vessel has a vane having a triangular cross section;
heating, by a heater in the vane of the vessel, the vessel for removing a material on the vessel, wherein a cross section of the heater is located in the triangular cross section of the vane;
transferring a first signal, by a converter, to the cooling controller when heating the vessel; and
reducing the first cooling output to a second cooling output by the cooling controller based on the first signal.

2. The method of claim 1, wherein maintaining the temperature of the vessel is such that the temperature of the vessel is below a melting point of the material on the vessel.

3. The method of claim 1, wherein heating the vessel for removing the material on the vessel is such that the temperature of the vessel is increased over a melting point of the material on the vessel.

4. The method of claim 1, further comprising:
decreasing the temperature of the vessel after removing the material on the vessel.

5. The method of claim 4, wherein decreasing the temperature of the vessel comprises:
transferring a second signal, by the converter, to the cooling controller after removing the material on the vessel; and
increasing the second cooling output to a third cooling output by the cooling controller based on the second signal.

6. The method of claim 5, wherein decreasing the temperature of the vessel further comprises:
measuring the temperature of the vessel by a temperature sensor; and
transferring a temperature data from the temperature sensor to the converter to form a third signal.

7. The method of claim 6, further comprising:
transferring the third signal, by the converter, to the cooling controller; and
reducing the third cooling output by the cooling controller based on the third signal.

8. The method of claim 1, wherein reducing the first cooling output to the second cooling output comprises:
decreasing a flow rate of a fluid channel on the vessel.

9. A method, comprising:
performing a lithography process by using a semiconductor apparatus;
maintaining a first temperature of a vessel of the semiconductor apparatus with a first cooling output, wherein the vessel has a vane;
heating the vessel from the first temperature to a second temperature to remove a target material on the vessel, wherein the target material is melted to flow downwards along a surface of the vane to a bottom of the vane, wherein maintaining the first temperature of the vessel and heating the vessel from the first temperature to the second temperature are performed while the lithography process is performed;
during heating the vessel, reducing the first cooling output to a second cooling output; and
maintaining the second cooling output until the target material is removed.

10. The method of claim 9, wherein maintaining the first temperature of the vessel is performed such that the first temperature of the vessel is lower than a melting point of the target material.

11. The method of claim 9, wherein the second temperature higher than a melting point of the target material.

12. The method of claim 11, further comprising:
after heating the vessel to remove the target material, reducing the second temperature of the vessel to a third temperature lower than the melting point of the target material.

13. The method of claim 12, further comprising:
during reducing the second temperature of the vessel to the third temperature, increasing the second cooling output to a third cooling output higher than the first cooling output.

14. The method of claim 13, further comprising:
after reducing the second temperature of the vessel to the third temperature, reducing the third cooling output to a fourth cooling output substantially equal to the first cooling output.

15. The method of claim 12, wherein reducing the second temperature of the vessel to the third temperature is performed such that the third temperature is substantially equal to the first temperature of the vessel.

16. A method, comprising:
performing a lithography process using a semiconductor apparatus;
causing a cooling fluid to flow in a fluid channel that is in thermal contact with a vessel of the semiconductor apparatus;
increasing a temperature of the vessel to remove a target material on the vessel;
while increasing the temperature of the vessel, reducing a flow rate of the cooling fluid from a first flow rate value to a second flow rate value;
during the lithography process, increasing the flow rate of the cooling fluid from the second flow rate value to a third flow rate value to reduce the temperature of the vessel to a temperature lower than a melting point of the target material, wherein the third flow rate value is higher than the first flow rate value; and
reducing the flow rate of the cooling fluid from the third flow rate value to a fourth flow rate value.

17. The method of claim 16, wherein reducing the flow rate of the cooling fluid from the first flow rate value to the second flow rate value is performed such that the temperature of the vessel is higher than a melting point of the target material.

18. The method of claim 16, further comprising:
after reducing the flow rate of the cooling fluid from the third flow rate value to the fourth flow rate value, maintaining the fourth flow rate value substantially equal to the first flow rate value.

19. The method of claim 16, further comprising:
after reducing the flow rate of the cooling fluid from the third flow rate value to the fourth flow rate value, maintaining the temperature of the vessel below the melting point of the target material.

20. The method of claim 16, wherein increasing the temperature of the vessel is performed during the lithography process.

* * * * *